US009520506B2

(12) United States Patent
Luo et al.

(10) Patent No.: US 9,520,506 B2
(45) Date of Patent: Dec. 13, 2016

(54) 3D HIGH VOLTAGE CHARGE PUMP

(71) Applicant: GLOBALFOUNDRIES Singapore Pte. Ltd., Singapore (SG)

(72) Inventors: Laiqiang Luo, Singapore (SG); Xinshu Cai, Singapore (SG); Danny Shum, Singapore (SG); Fan Zhang, Singapore (SG); Khee Yong Lim, Singapore (SG); Juan Boon Tan, Singapore (SG); Shaoqiang Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/338,354

(22) Filed: Jul. 23, 2014

(65) Prior Publication Data

US 2015/0028407 A1 Jan. 29, 2015

Related U.S. Application Data

(60) Provisional application No. 61/857,256, filed on Jul. 23, 2013.

(51) Int. Cl.
*H01L 29/94* (2006.01)
*H01L 29/66* (2006.01)
(Continued)

(52) U.S. Cl.
CPC ........... *H01L 29/94* (2013.01); *H01L 23/5223* (2013.01); *H01L 27/0805* (2013.01); *H01L 28/86* (2013.01);
(Continued)

(58) Field of Classification Search
CPC ..................................................... H01L 29/24
See application file for complete search history.

(56) References Cited

U.S. PATENT DOCUMENTS 6,107,863 A * 8/2000 Iwata ................. H03K 19/0013
327/536
7,518,850 B2 * 4/2009 Kim ..................... H01L 23/5223
257/303

* cited by examiner

*Primary Examiner* — Fernando L Toledo
*Assistant Examiner* — Valerie N Newton
(74) *Attorney, Agent, or Firm* — Horizon IP Pte. Ltd.

(57) ABSTRACT

A capacitor and method of forming a capacitor are presented. The capacitor includes a substrate having a capacitor region in which the capacitor is disposed. The capacitor includes first, second and third sub-capacitors (C1, C2 and C3). The C1 comprises a metal oxide semiconductor (MOS) capacitor which includes a gate on the substrate. The gate includes a gate electrode over a gate dielectric. A first C1 plate is served by the gate electrode, a second C1 plate is served by the substrate of the capacitor region and a C1 capacitor dielectric is served by the gate dielectric. The C2 includes a back-end-of-line (BEOL) vertical capacitor disposed in ILD layers with metal levels and via levels. A plurality of metal lines are disposed in the metal levels. The metal lines of a metal level are grouped in alternating first and second groups, the first group serves as first C2 plates and second group serves as second C2 plates and the dielectric layers between the first and second groups serve as C2 capacitor dielectrics. The C3 includes a first C3 plate served by the gate electrode, a second C3 plate served by second group lines in the first metal level of the ILD layers, and a C3 capacitor dielectric is served by the first via level dielectric below M1 and above the gate electrode. A first capacitor terminal is coupled to first capacitor plates of C1, C2 and C3 and a second capacitor terminal is coupled to second capacitor plates of C1, C2 and C3.

20 Claims, 12 Drawing Sheets

(51) Int. Cl.
*H01L 23/522* (2006.01)
*H01L 27/08* (2006.01)
*H01L 49/02* (2006.01)

(52) U.S. Cl.
CPC ......... *H01L 28/90* (2013.01); *H01L 29/66181* (2013.01); *H01L 2924/0002* (2013.01)

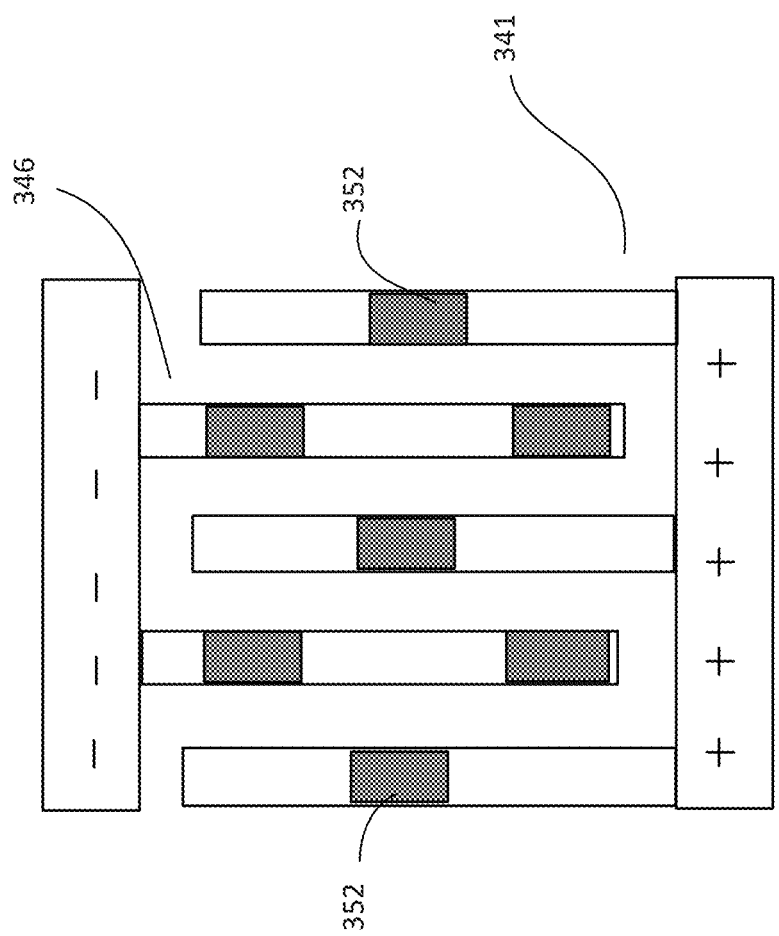

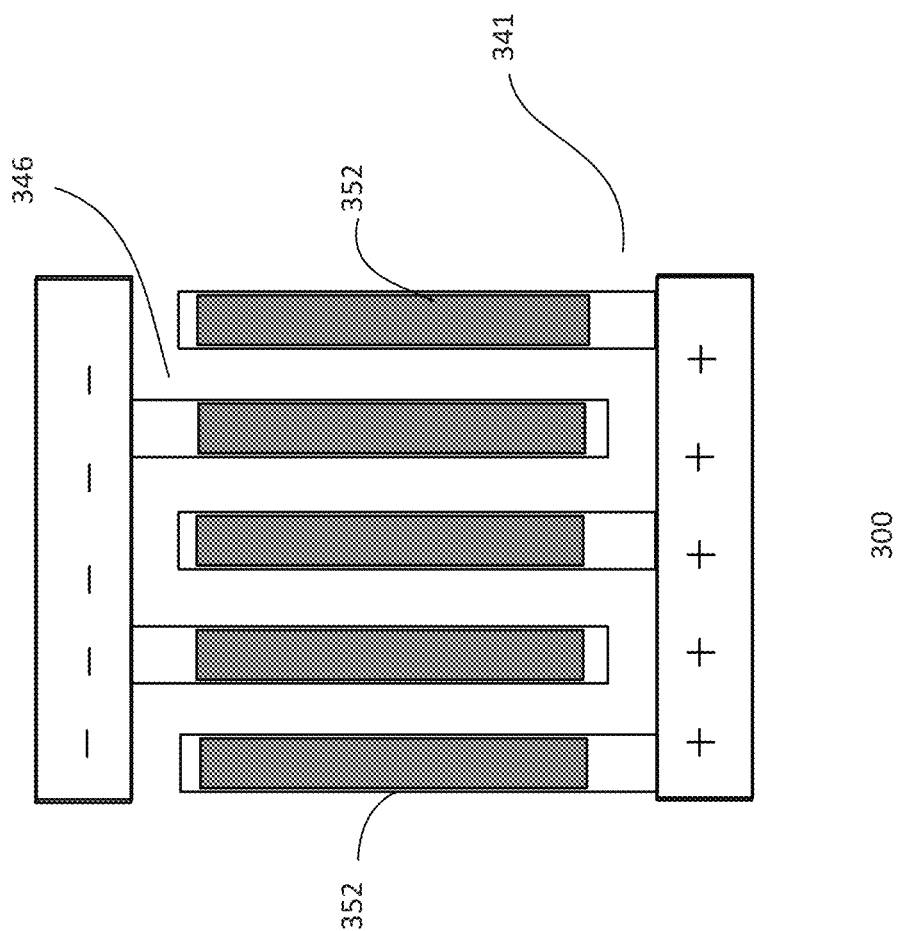

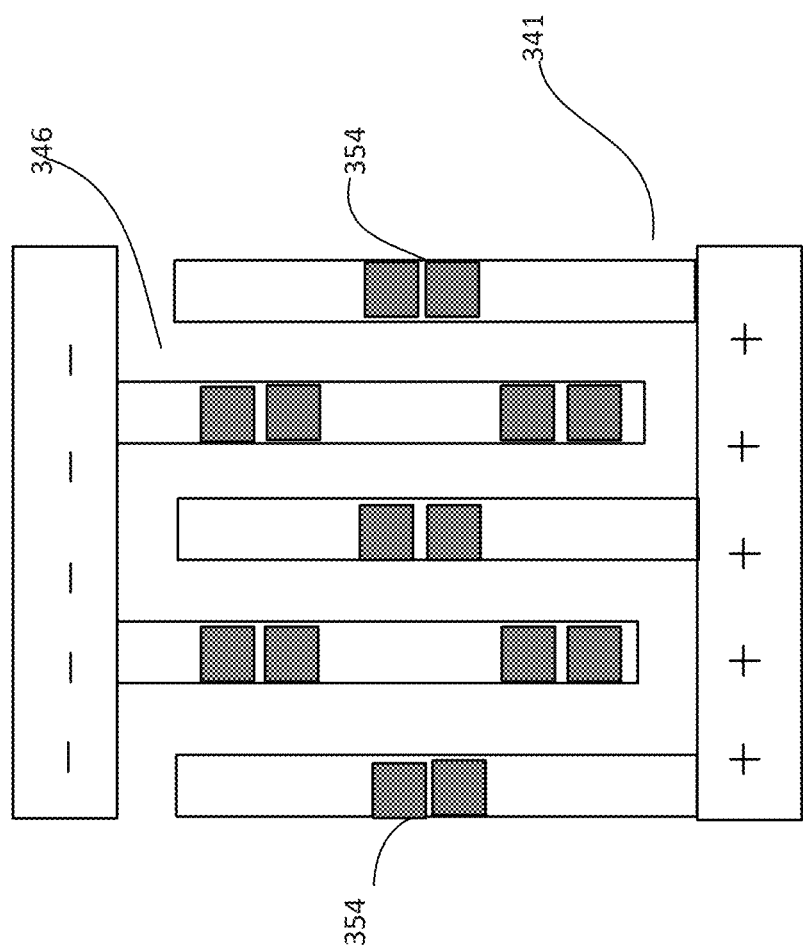

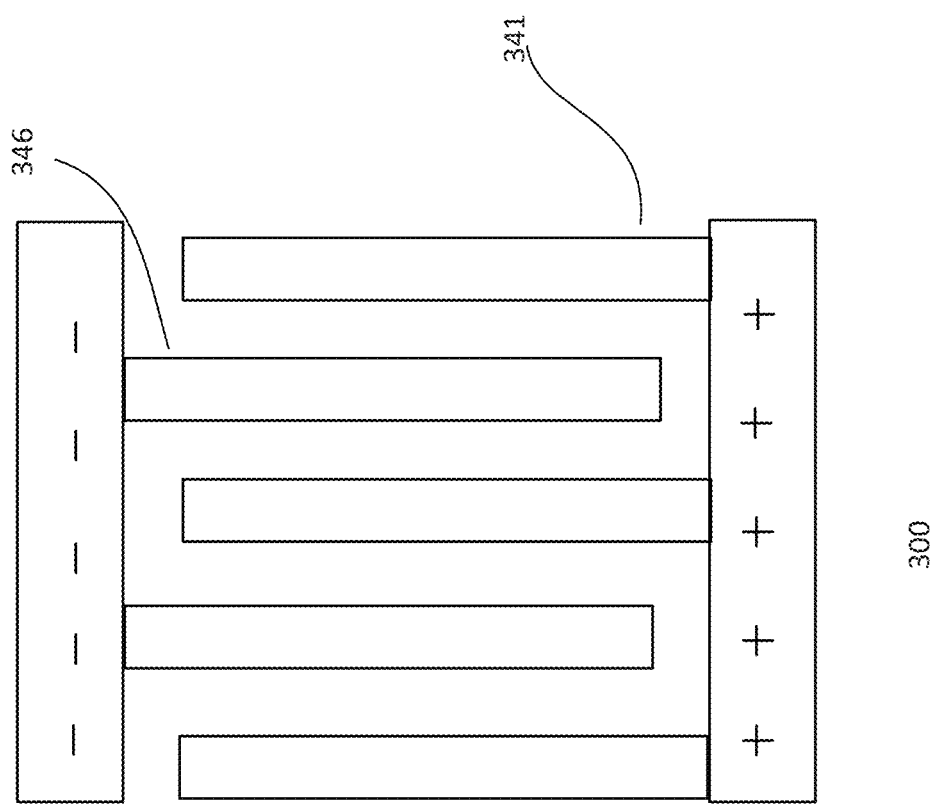

| Memory Module Density (Mbits) | Area shrinkage with high capacitance per area ratio capacitor (%) |
|---|---|
| 0.5 | ~25 |
| 1 | ~16 |
| 2 | ~10 |
| 4 | ~6 |

Fig. 4

3D HIGH VOLTAGE CHARGE PUMP

CROSS-REFERENCE TO RELATED APPLICATION

This application claims the priority benefit of U.S. Provisional Application Ser. No. 61/857,256, filed on Jul. 23, 2013, which is herein incorporated by reference in its entirety.

BACKGROUND

Semiconductor memories are used for storage of information. Various types of memories are available. One type of memories is non-volatile memories (NVMs). Non-volatile memories maintain information stored, even when power is turned off. Non-volatile memories may be employed as stand-alone devices, such as NVM devices. Non-volatile memories may also be integrated with other circuit modules, such as in the case of a system-on-chip (SoC) device. For example, a SOC may include logic and processing memory modules integrated into an integrated circuit (IC) or chip.

Non-volatile memories include associated circuitry for accessing memory cells. One circuit needed is a charge pump. The charge pump is a high voltage (HV) charge pump which generates a high voltage used in program or erase memory accesses of the NVM cells. An integral component of a charge pump is the capacitor. A charge pump includes a plurality of high capacitance capacitors for generating a high voltage output, which can be multiple times that of the input voltage.

However, conventional capacitors employed in charge pumps occupy large areas. For example, capacitance is related to the area of the capacitor. This can result in the capacitors occupying a significant part of the overall area of the charge pump. For example, the capacitors may occupy about 95% of the total area of the charge pump.

From the foregoing discussion, it is desirable to provide a capacitor which has a high capacitance per area ratio, enabling reduction of area occupied, for example, for charge pumps.

SUMMARY

Embodiments generally relate to high capacitance per area capacitors. The capacitor, for example, can be used in a charge pump. In one embodiment, a capacitor is presented. The capacitor includes a substrate having a capacitor region in which the capacitor is disposed. The capacitor includes first, second and third sub-capacitors (C1, C2 and C3). The C1 comprises a metal oxide semiconductor (MOS) capacitor which includes a gate on the substrate. The gate includes a gate electrode over a gate dielectric. A first C1 plate is served by the gate electrode, a second C1 plate is served by the substrate of the capacitor region and a C1 capacitor dielectric is served by the gate dielectric. The C2 includes a back-end-of-line (BEOL) vertical capacitor disposed in ILD layers with metal levels and via levels. A plurality of metal lines are disposed in the metal levels. The metal lines of a metal level are grouped in alternating first and second groups, the first group serves as first C2 plates and second group serves as second C2 plates and the dielectric layers between the first and second groups serve as C2 capacitor dielectrics. The C3 includes a first C3 plate served by the gate electrode, a second C3 plate served by second group lines in the first metal level of the ILD layers, and a C3 capacitor dielectric is served by the first via level dielectric below M1 and above the gate electrode. A first capacitor terminal is coupled to first capacitor plates of C1, C2 and C3 and a second capacitor terminal is coupled to second capacitor plates of C1, C2 and C3.

In another embodiment, a charge pump is disclosed. The charge pump includes a pump circuit and a pump capacitor. The pump capacitor includes a substrate having a capacitor region in which the capacitor is disposed. The pump capacitor includes first, second and third sub-capacitors (C1, C2 and C3). The C1 comprises a metal oxide semiconductor (MOS) capacitor which includes a gate on the substrate. The gate includes a gate electrode over a gate dielectric. A first C1 plate is served by the gate electrode, a second C1 plate is served by the substrate of the capacitor region and a C1 capacitor dielectric is served by the gate dielectric. The C2 includes a back-end-of-line (BEOL) vertical capacitor disposed in ILD layers with metal levels and via levels. A plurality of metal lines are disposed in the metal levels. The metal lines of a metal level are grouped in alternating first and second groups, the first group serves as first C2 plates and second group serves as second C2 plates and the dielectric layers between the first and second groups serve as C2 capacitor dielectrics. The C3 includes a first C3 plate served by the gate electrode, a second C3 plate served by second group lines in the first metal level of the ILD layers, and a C3 capacitor dielectric is served by the first via level dielectric below M1 and above the gate electrode. A first capacitor terminal is coupled to first capacitor plates of C1, C2 and C3 and a second capacitor terminal is coupled to second capacitor plates of C1, C2 and C3.

In yet another embodiment, a capacitor is disclosed. The capacitor includes a substrate having a capacitor region in which the capacitor is disposed. The capacitor includes first, second and third sub-capacitors (C1, C2, and C3). The C1 includes a metal oxide semiconductor (MOS) capacitor. The C2 includes a back-end-of line vertical capacitor disposed in interlevel dielectric (ILD) layers with metal levels and via levels over the substrate, and the C3 is disposed in between C1 and C2. A first C3 plate is served by gate electrode of the MOS capacitor, a second C3 plate is served by one group of metal lines in the lowest metal level of the ILD layers and a C3 capacitor dielectric is served by a dielectric layer of the ILD layers above the gate electrode.

In another embodiment, a method for forming a device is disclosed. The method includes providing a substrate having a capacitor region in which a capacitor is formed and forming the capacitor having first, second and third sub-capacitors (C1, C2 and C3). The C1 is formed by performing front-end-of-line processes. The first sub-capacitor includes a metal oxide semiconductor (MOS) capacitor which includes a gate on the substrate. The gate includes a gate electrode over a gate dielectric. A first C1 plate is served by the gate electrode, a second C1 plate is served by the substrate of the capacitor region, and a C1 capacitor dielectric is served by the gate dielectric. The C2 is formed by performing back-end-of-line (BEOL) processes. The C2 includes a vertical capacitor disposed in ILD layers with metal levels and via levels. A plurality of metal lines are disposed in the metal levels. The metal lines of a metal level are grouped in alternating first and second groups. The first group serves as first C2 plates and second group serves as second C2 plates and the dielectric layers between the first and second groups serve as C2 capacitor dielectrics. The C3 is formed between C1 and C2. A first C3 plate is served by the gate electrode, a second C3 plate is formed by second group lines in the first metal level of the ILD layers, and a C3 capacitor dielectric is formed by the first via level dielectric below M1 and above the gate electrode. The method further includes coupling the first capacitor plates of C1, C2 and C3 to a first capacitor terminal and coupling the second capacitor plates of C1, C2 and C3 to a second capacitor terminal.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which:

FIGS. 3a-3f illustrate various embodiments of interconnections for metal layers in the back end portion of a capacitor; and FIG. 4 shows a table indicating the percentage of shrinkage of a memory module using a high capacitance per area ratio capacitor based on the density of the memory module.

DETAILED DESCRIPTION

Embodiments generally relate to semiconductor devices. In particular, the embodiment relates to high capacitance per area capacitors. Such capacitors, for example, are employed in charge pumps for NVM modules. The NVM modules may be stand-alone NVM devices or integrated with other modules to form ICs, such as SOCs. Other uses of the capacitors or other types of devices may also be useful.

Figure 1A:
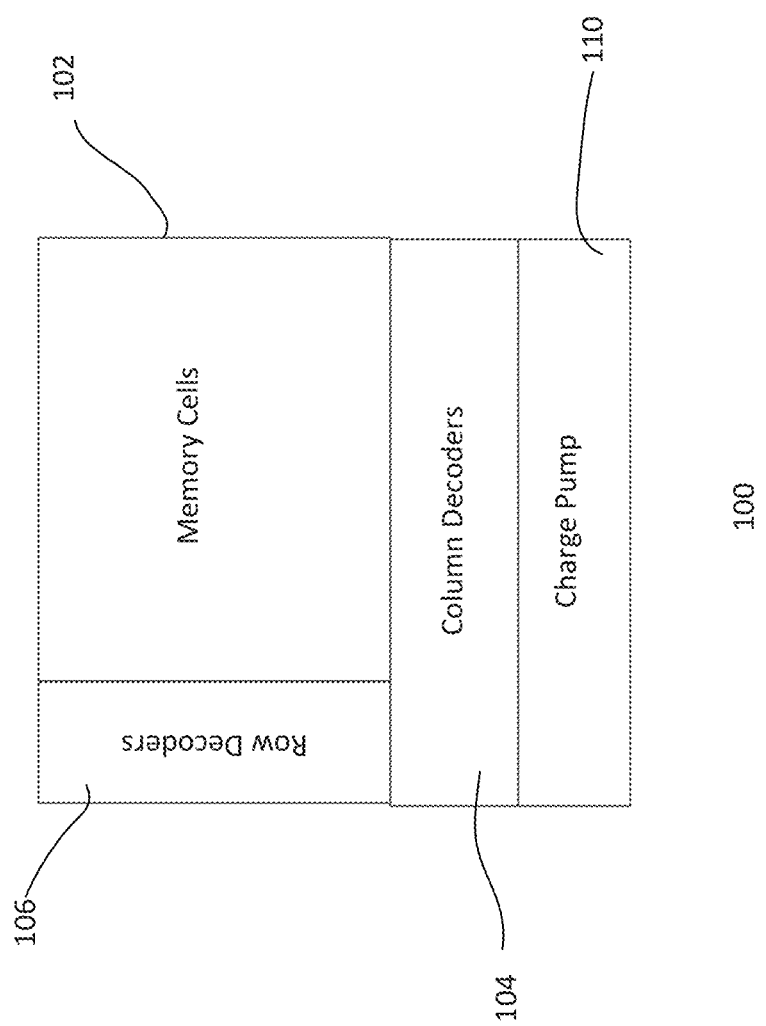
FIGS. 1a and 1b show block diagrams of a NVM module and a HV charge pump of the NVM module, respectively.

FIG. 1a shows a block diagram of a NVM module 100. As discussed, the NVM module may be a stand-alone NVM device or integrated with other modules. As shown, the NVM module includes a cell block 102, column decoder block 104, row decoder block 106 and a charge pump block 110. In one embodiment, the cell block includes an array of NVM cells arranged in rows and columns. For example, the cells are interconnected in the row direction by wordlines (WLs) and column direction by bitlines (BLs). Additionally, source lines (SLs), control gate (CG) lines may be provided, depending on the type of NVM cells. The row decoder block may include high voltage (HV) circuits, such as for SL and CG circuitry. The SL and CG circuitry are used to perform various types of memory accesses, such as program and erase accesses. Low voltage (LV) circuitry may be included to access a row of memory cells, such as WL select circuitry. The column decoder block, for example, includes LV circuits, such as BL select circuitry. The column decoders are used to select a column of cells to access. As for the charge pump block, it includes circuitry to generate high voltages for program and erase accesses.

Figure 1B:
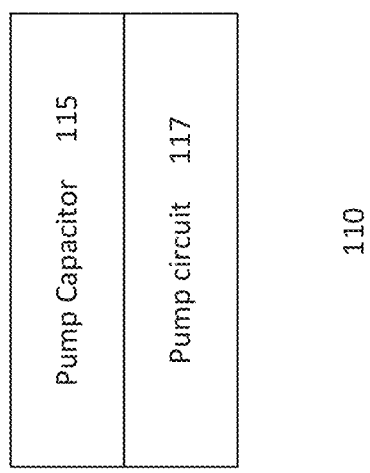

FIG. 1b shows a block diagram of an exemplary embodiment of a charge pump block 110. As shown, the charge pump block includes a capacitor sub-block 115 and a pump circuit sub-block 117. The pump circuit sub-block may include transistors and resistors while the capacitor sub-block includes capacitors. In one embodiment, the capacitor sub-block includes high capacitance to area ratio capacitors. The high capacitance to area ratio capacitors enables a reduction in area occupied by the charge pump. The area reduction may be about 16-25% for a NVM module with 1 Mbits or less cell density. Other area reductions may also be achieved. The amount of area reduction may depend on, for example, size or cell density of the NVM module.

Figure 1C:
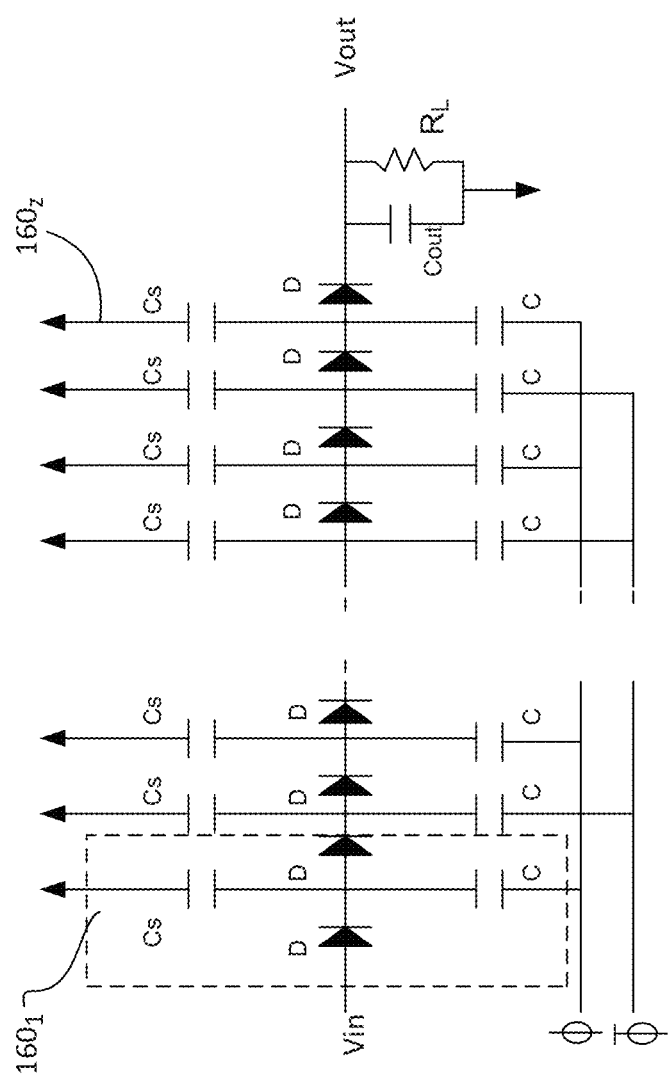
FIG. 1c shows an exemplary embodiment of a charge pump.

FIG. 1c shows at exemplary HV charge pump 110. The charge pump, for example, may be employed in a memory module, such as a NVM module. As shown, the charge pump includes a plurality of capacitor stages $160_{1-z}$. A stage includes a diode D and a capacitor C. The diode includes anode and cathode terminals, with the anode terminal serving as an input terminal of the capacitor stage. As for the cathode terminal, it serves as the output terminal of the capacitor stage. The capacitor includes first and second capacitor terminals. The first capacitor terminal is coupled to a clock input while the second capacitor terminal is coupled to the capacitor stage output or cathode diode terminal. In one embodiment, the capacitor of a capacitor stage includes a high capacitance per area ratio capacitor. Also, a stage includes a parasitic capacitance Cs which is coupled between ground and output of the capacitor stage.

As shown, the capacitor stages are coupled in series. For example, the capacitor stage output of a previous stage is coupled to the capacitor stage input of a subsequent stage. The input of the first capacitor stage is coupled to a pump input Vin. The capacitor stages are grouped into alternate fast and second groups. Capacitors of the first group are coupled to clock while the capacitors of the second group are coupled to clock bar. An output diode is coupled to the output of the last capacitor stage. As shown, the anode terminal is coupled to the last capacitor stage output and the cathode terminal is coupled to the output of the pump Vout. An output circuit is coupled to the pump output and ground. In one embodiment, the output circuit includes a capacitor and a resistor coupled parallel between ground and pump. Other types of charge pumps may also be useful. By providing high capacitance per area ratio capacitors in the charge pump enables a reduction in area occupied by the charge pump.

Figure 2A:
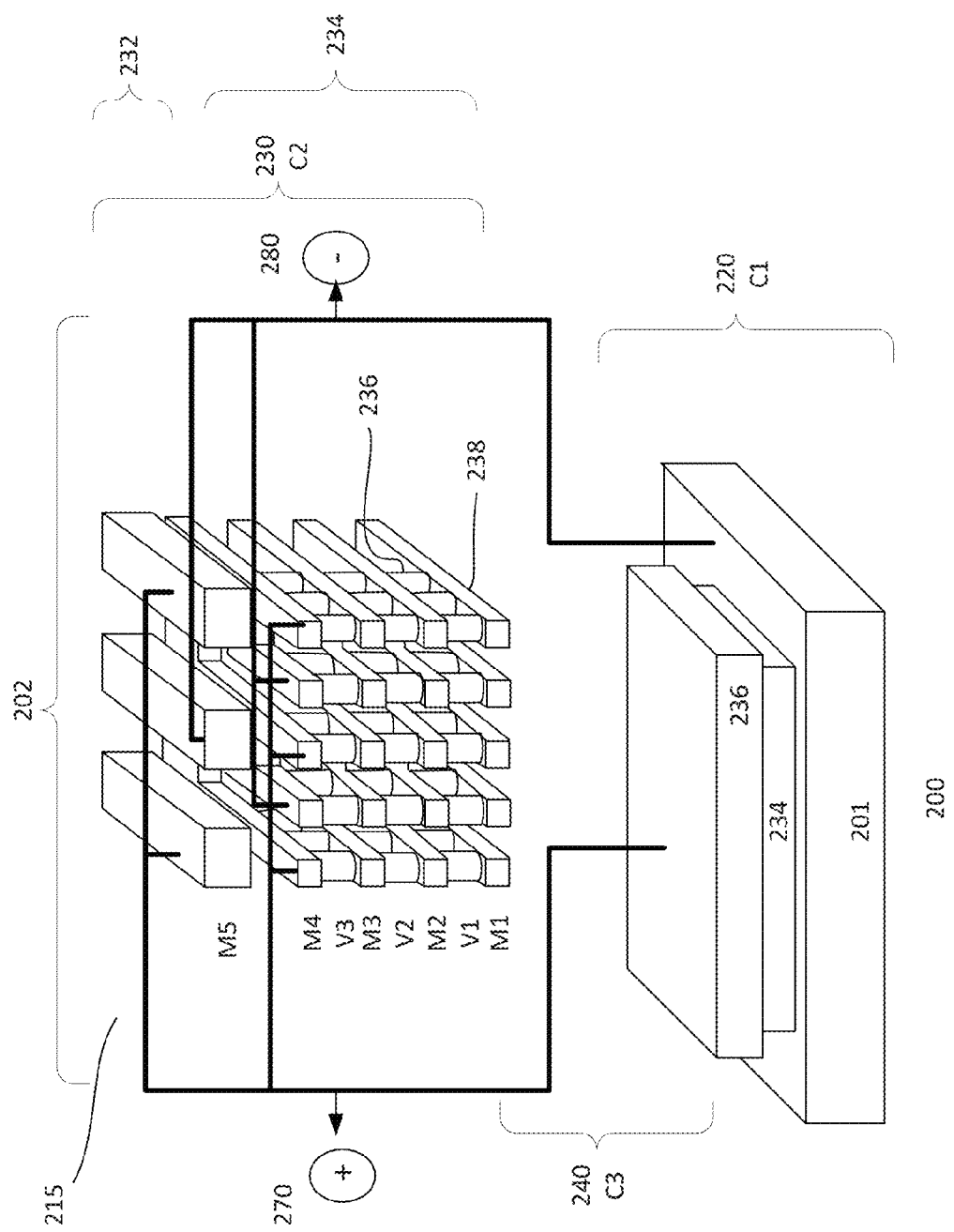
FIG. 2a shows an embodiment of a capacitor.

FIG. 2a shows an embodiment of a device 200. The device includes a capacitor 215. The capacitor, in one embodiment, is a high capacitance to area ratio capacitor. The high capacitance to area ratio capacitor, for example, may be integrated in, for example, HV charge pumps. In one embodiment, the capacitor is use in a charge pump of a NVM module in a device. The device, for example, may be a NVM stand-alone device or integrated into an IC, such as a SoC. Other types of devices may also be useful. Providing the capacitor in other applications may also be useful as well.

The capacitor can easily be integrated into an integrated circuit (IC). For example, the capacitor is compatible with existing semiconductor processes used in forming semiconductor devices or ICs. In semiconductor processing, a semiconductor substrate 201 is provided. The substrate, for example, is a semiconductor substrate, such as a silicon substrate or wafer. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

The substrate includes a capacitor region 202. Other regions (not shown) may also be provided. For example, the device may include, array region, logic regions. The logic region may include various types of regions, such as high voltage (HV), low voltage (LV) and intermediate voltage (IV) regions. High voltage devices are formed in the high voltage region, low voltage devices are formed in the low voltage region and intermediate voltage devices are formed in the intermediate voltage region. The devices, for example, are metal oxide semiconductor (MOS) transistors. Other types of devices or device regions may also be useful.

Front end of line (FEOL) processing is performed on the substrate. For example, isolation regions are formed to isolate different device regions. The isolation regions, for example, are shallow trench isolation (STI) region. Other types of isolation regions may also be useful. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. Gates are formed by, for example, forming gate oxide layer, such as thermal silicon oxide followed by a gate electrode layer, such as polysilicon. The gate electrode may be doped. Other types of gate materials may also be useful. Separate processes may be performed for forming gate dielectrics of the different voltage transistors. This is due to, for example, different gate oxide thicknesses associated with the different voltage transistors. For example, HV transistor will have a thicker gate dielectric than a LV transistor.

After the gate layers are formed, they are patterned to form gates. For example, a photoresist mask may be used for a reactive ion etch (RIE) to pattern the gate layers to form the gates. Source/drain (S/D) are formed adjacent to the gates. The S/D regions are heavily doped regions. Depending on the type of device, the S/D regions may be heavily doped n-type or p-type regions. For n-type transistors, S/D regions are heavily doped n-type regions and for p-type transistors, S/D regions are heavily doped p-type regions. Lightly doped regions may be provided for the S/D regions. Dielectric sidewall spacers may be provided on sidewalls of the gates to facilitate forming lightly doped regions. Separate implants may be employed to form different doped regions using, for example, implant masks, such as photoresist mask.

After forming transistors, back-end-of-line (BEOL) processing is performed. The BEOL process includes forming interconnects in interlevel dielectric (ILD) layers. An ILD layer includes a metal level and a contact level. Generally, the metal level includes conductors or metal lines while the contact level includes contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD levels. For example, x number of ILD levels may be provided. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level, it may be referred to as CA.

The BEOL process, for example, commences by forming a dielectric layer over the transistors formed in the FEOL process. The dielectric layer may be silicon oxide. For example, the dielectric layer may be silicon oxide formed by chemical vapor deposition (CVD). The dielectric layer serves as a premetal dielectric layer or first contact layer of the BEOL process. The dielectric layer may be referred to as CA level of the BEOL process. Contacts are formed in the CA level dielectric layer. The contacts may be formed by single damascene process. Via openings are formed in the dielectric layer using mask and etch techniques. For example, a pattern resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive material, leaving contact plugs in the CA level.

After forming contacts in the CA level, the BEOL process continues to form dielectric layer over the substrate, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful.

The process continues to form additional ILD layers. For example, process continues to form second to fourth ILD layers over the M1 level dielectric layer. The second ILD layer (V1, M2), third ILD layer (V2, M3) and fourth ILD layer (V3, M4) are formed over M1. Forming less or more ILD layers over M1 may also be useful. The number of ILD layers may depend on, for example, design requirements or the logic process involved. These ILD layers may be referred to as intermediate ILD layers. The intermediate ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the intermediate ILD layers may be formed by dual damascene technique. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive material is removed, forming conductor and contacts in the intermediate ILD layer.

A dielectric liner may be disposed between ILD levels and on the substrate. The dielectric liner, for example, serves as an etch stop layer. The dielectric liner may be formed of a low k dielectric. For example, the dielectric liner may be nBLOK. Other types of dielectric materials for the dielectric liner may also be useful.

Additional ILD layers may be provided over the top intermediate ILD layer. As shown, M5 is formed over M4. Forming more than 1 ILD layers above the intermediate ILD layers may also be useful. The number of ILD layers above the intermediate ILD layers may depend on, for example, device requirements and/or the logic process involved. The layer above the intermediate ILD layers may be referred to as upper ILD layers. The upper ILD layer or layers, for example, above M4 may have different design rules, such as critical dimension (CD). For example, upper ILD layer may have a larger CD than the intermediate ILD layers. For example, the upper ILD layer may have a CD which is 2× or 6× the CD of the intermediate ILD layers. Interconnects and contacts in the upper ILD layers may be formed by dual damascene processes. Other techniques may also be useful.

The capacitor region 202 includes a high capacitance per area capacitor 215. The capacitor region may be surrounded by an isolation region (not shown) such as a STI. The capacitor includes a plurality of sub-capacitors. In one embodiment, the capacitor includes a first sub-capacitor 220 (C1), a second sub-capacitor 230 (C2) and a third sub-capacitor 240 (C3). A sub-capacitor includes a first capacitor plate and a second capacitor plate separated by a capacitor dielectric layer. A first sub-capacitor terminal is coupled to the first capacitor plate and a second sub-capacitor terminal is coupled to the second capacitor plate. The capacitor plates or electrodes are formed of a conductive material. The conductive material may be doped silicon, doped polysilicon, or metal. The capacitor plates of a capacitor need not be formed of the same conductive material. For example, a combination of conductive materials may be used to serve as capacitor plates of a sub-capacitor. Similarly, different sub-capacitors need not have the same plate materials. As for the capacitor dielectric layer, it may be silicon oxide. Other types of dielectric materials or a combination of dielectric materials, such as a dielectric stack, may also be useful to serve as the capacitor dielectric. The different sub-capacitors need not have the same type of capacitor dielectric materials.

The first terminal of a sub-capacitor, for example, is a first polarity terminal and the second sub-capacitor terminal is a second polarity terminal. As shown, the first terminal is a positive terminal and the second terminal is a negative terminal. Other configurations of terminals may also be useful. The sub-capacitors are coupled in parallel. For example, first terminals of the sub-capacitors commonly coupled to form a first capacitor terminal 270 and second terminals of the sub-capacitors are commonly coupled to form a second capacitor terminal 280. This provides a total capacitance of the capacitor equal to the sum of the capacitance of the first sub-capacitor C1, the second sub-capacitor C2 and the third sub-capacitor C3.

In one embodiment, the first sub-capacitor C1 is a metal oxide semiconductor (MOS) capacitor. For example, the MOS capacitor includes a gate disposed on the substrate in the region. The gate includes a gate electrode 236 over a gate dielectric 234. For example, the gate electrode may be polysilicon and the gate dielectric may be silicon oxide. In one embodiment, the gate may be a HV gate. Other types of gates or gate materials may also be useful. The substrate is doped. For example, the substrate may be doped with p-type dopants. Providing n-type dopants may also be useful. The doped substrate may be the lightly doped p-type starting substrate or a doped well of a transistor body.

The gate electrode serves as one of the capacitor plates, the substrate serves as the other capacitor plate while the gate dielectric serves as the capacitor dielectric of the first sub-capacitor 220. In one embodiment, the gate electrode serves as the first capacitor plate and the substrate serves as the second capacitor plate. For ample, the gate electrode is coupled to the first capacitor terminal 270 and the substrate is coupled to the second capacitor terminal 280. As shown, the gate electrode is coupled to the positive capacitor terminal and the substrate is coupled to the negative capacitor terminal. Other configurations of capacitor terminals may also be useful. The MOS capacitor may be formed as part of the FEOL process for forming transistors.

The capacitance of the first sub-capacitor C1 is determined by the surface area. For example, the capacitance is determined by the surface area of the gate dielectric. In one embodiment, the capacitance of C1 is less than the desired capacitance of the high capacitance per area capacitor.

The second sub-capacitor C2, in one embodiment, is a BEOL capacitor. For example, the second sub-capacitor is a vertical capacitor disposed in the ILD layers of the device. The second sub-capacitor C2, in one embodiment, includes an upper and lower portion 232 and 234. For example, the lower portion is disposed in the intermediate ILD levels, including lowest metal level, and the upper portion is disposed in the upper ILD level. As shown, the lower portion is disposed in M1, V1, M2, V2, M3, V3, and M4 while the upper portion is disposed in M5. Providing the upper portion in V4 and M5 may also be useful. Other configurations of C2 may also be useful. For example, C2 may only include the lower portion or the upper portion may include more than M5 or is above M5.

Regarding the lower portion, it includes a plurality of elongated conductive lines or bars in metal levels. For example, M1, M2, M3 and M4 include a plurality of elongated metal lines 238. The metal lines for example, are disposed along a first direction in parallel. Adjacent lines are separated by a space filled with dielectric material of the metal level. The metal lines are disposed in alignment in the different metal levels. In one embodiment, a metal level includes an odd number of lines. For example, a metal level includes s number of lines, where s is an odd number. As shown, a metal level is provided with five lines. Providing other odd number of lines may also be useful. The lines of a metal level are arranged as alternating lines. For example, the plurality of lines are grouped into alternating first and second lines. One group has one more lines than the other group. As shown, the first group has one more line than the second group.

The lines of a group within a metal level may be interconnected. For example, the first group of metal lines of a metal level may be connected at a first end of the lines while the second group of metal lines of a metal level may be connected at a second end of the lines. Providing lines which are not interconnected within a metal level may also be useful. Other configurations of metal lines of a metal level may also be useful.

In one embodiment, the lines in the metal level are coupled to lines of other metal levels by interconnections 236 in the via level. For example, interconnections in the V1 level couple lines in M1 to lines in M2, interconnections in V2 level couple lines in M2 to lines in M3, and interconnections in V3 couple lines in M3 to lines in M4. The interconnections in the via level may be via contacts, via bars or a combination thereof. Via bars, for example, are elongated conductive members, similar to conductive lines, but at the via level. In the case of vias, they can be aligned with other vias of other lines or staggered. The vias may be arranged as groups of vias, aligned or staggered. Other configurations of interconnects may also be useful.

Figure 3B:
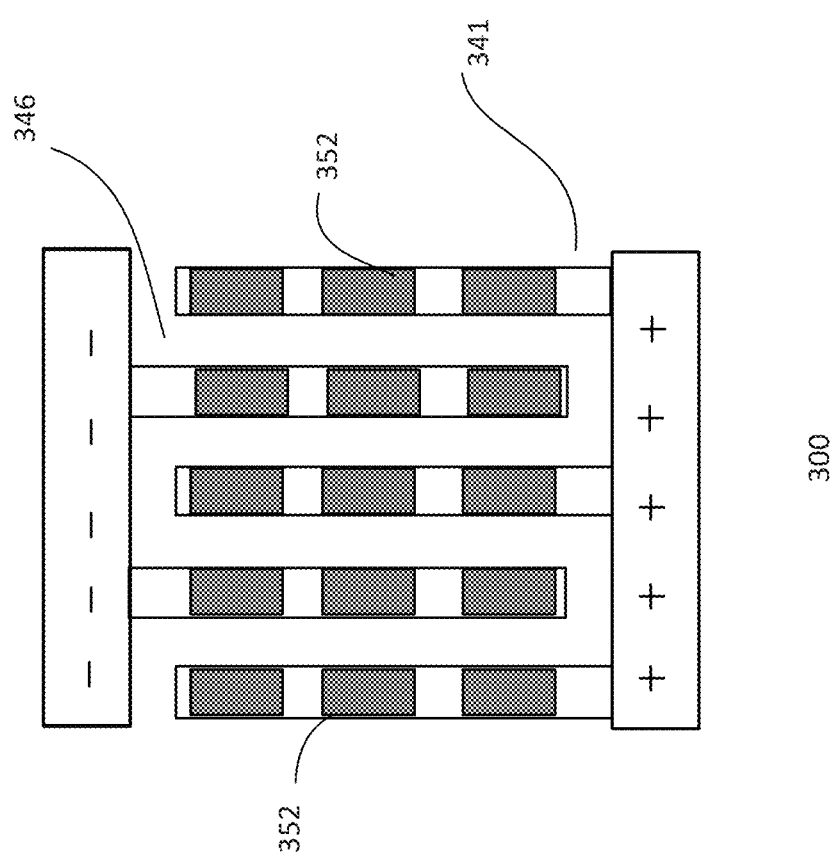

FIGS. 3a-3c show various embodiments 300 of interconnections as via bars 352 in the via level. As shown, a metal level includes 5 metal lines separated into first and second groups 341 and 346. Other odd number of lines, excluding 1, may also be useful. For example, first group of lines 341 are interconnected at a first end of the lines and the second group of lines 346 are interconnected at a second end of the lines. As shown in FIGS. 3a-3b, via bars are elongated conductive members in the via level. The elongated members extend a minor portion of the lines of the metal level. As shown in FIG. 3a, the via bars of a via level are staggered. Alternatively, the via bars are aligned in a via level, as shown in FIG. 3b. In other embodiments, the via bar may extend a major or a substantial portion of the lines of the metal level, as shown in FIG. 3c. Other configurations of via bars may also be useful.

Figure 3E:
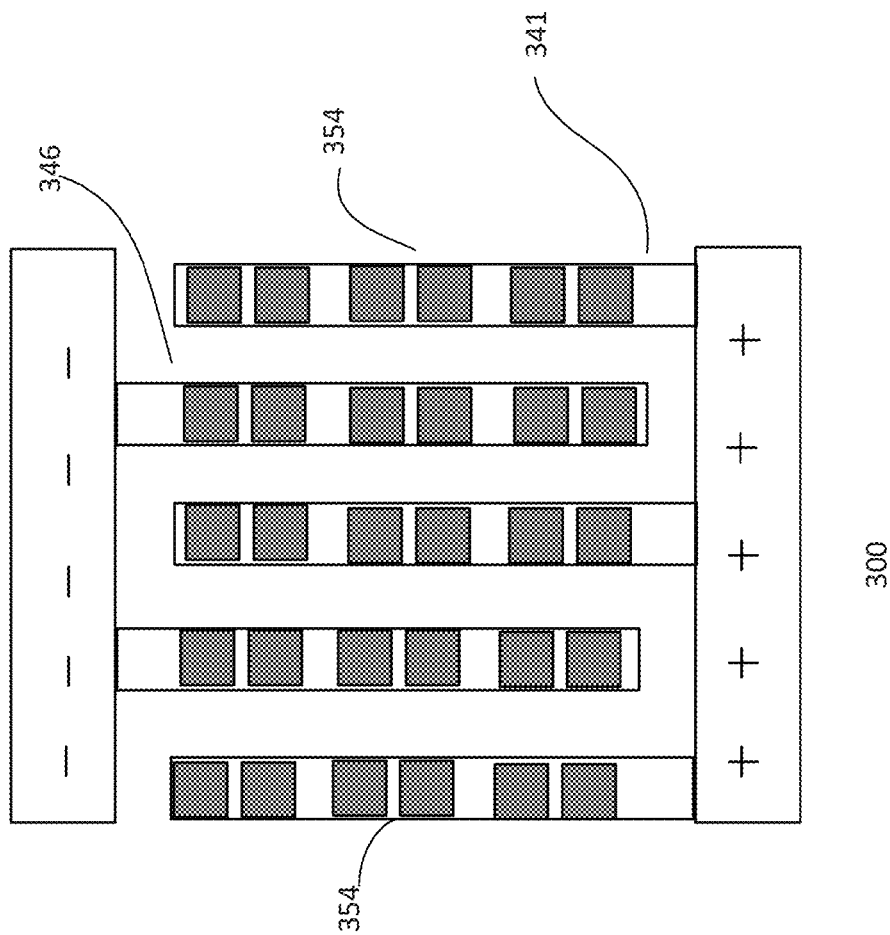

FIGS. 3d-3e illustrate various embodiments 300 of interconnections as via contacts groups 354 in the via level. As shown, a metal level includes 5 metal lines separated into first and second groups 341 and 346. Other odd number of lines, excluding 1, may also be useful. For example, first group of lines are interconnected at a first end of the lines and the second group of lines are interconnected at a second end of the lines. As shown, via contacts are grouped as multiple contacts. For example, the via contact group 354 includes 2 contacts. Providing other number of contacts, including 1 may also be useful. As shown in FIG. 3d, the via contact groups of a via level are staggered. Alternatively, the via contact groups in a via level are aligned, as shown in FIG. 3e. Other configurations of via groups may also be useful.

Referring back to FIG. 2a, in one embodiment, alternating first and second lines form first and second plates of a capacitor of the lower portion of sub-capacitor C2. In the case of s number of lines, the lower portion includes (s+1)/2 capacitors. For example, in the case of 5 lines, the lower portion of C2 includes 3 capacitors. The capacitors of C2 are coupled in parallel. This results in the lower portion C2 having a capacitance equal to the sum of the capacitors.

In the upper portion, similar to the lower portion, a plurality of conductive lines are provided in, for example, M5. Similarly, the number of conductive lines is an odd number. For example, the upper portion includes t number of conductive lines, where t is an odd number. However, the number of lines is less than the number of lines in the lower portion. This is due to, for example, different line width rule for the upper ILD level. For example, the width of M5 may be 2× or 6× that of the lower metal levels. Other configurations of upper and lower ILD levels may also be useful. For example, the upper portion may include addition metal levels. Providing the C2 with more metal levels increases the capacitance of C2. Of course, the number of metal level may depend on the process used to form the device.

The groups of lines may be interconnected, like in the lower metal levels. For example, first group of lines are interconnected at a first end of the lines and the second group of lines are interconnected at the second end of the lines. As shown, the lower portion includes 5 lines and the upper portion includes 3 lines. Other number of lines for the upper and lower portions may also be useful. In such case, the first group is coupled at a first end of the lines while there is only one second group line. The second end may be provided with a contact pad.

In one embodiment, alternating first and second lines form first and second plates of a capacitor of the upper portion of sub-capacitor C2. In the case of t number of lines, the upper portion includes (t+1)/2 capacitors. For example, in the case of 3 lines, the upper portion of C2 includes 2 capacitors. The capacitors in the upper and lower portions are C2, in one embodiment, are coupled in parallel.

The lines of the upper portion are coupled to lines of the metal level below by interconnections in the via level. For example, interconnections in V2 level couple lines in M3 to lines in M2. The interconnections in the via level may be via contacts, via bars or a combination thereof. Via bars, for example, are elongated conductive members, similar to conductive lines, but at the via level. In the case of vias, they can be aligned with other vias of other lines or staggered. The vias may be arranged as groups of vias, aligned or staggered. Other configurations of interconnects may also be useful. The lines are coupled to respective lines. For example, first lines in the upper portion are coupled to first lines in the lower portion and second line or lines are coupled to second line or lines in the lower portion, taken into account of lesser lines in the upper portion.

In one embodiment, the first plates of the capacitors of C2 (both lower and upper portions) are coupled to the first capacitor terminal 270 and the second plates of the capacitors of C2 are coupled to the second capacitor terminal 280. This creates a parallel connection between C1 and C2. The BEOL capacitor may be formed as part of the BEOL process for forming interconnects for the device.

In other embodiments, the lines of metal levels of C2 may not be interconnected or a combination of connected and not connected. For example, as shown in FIG. 3f, conductive lines of C2 coupled to lines of other metal level. The metal level 300, for example, includes 5 metal lines separated into first and second groups 341 and 346. Other odd number of lines, excluding 1, may also be useful. For example, first group of lines are interconnected at a first end of the lines and the second group of lines are interconnected at a second end of the lines. As shown, no interconnections are provided in the via levels. This produces a metal only capacitor.

In one embodiment, the lines on the upper portion are not interconnected to lines in the lower portion below. For example, lines in M5 are not connected to lines in M4. This may be due to different design rules, making it difficult to connect to lines below. In other cases, interconnections may be provided to connect lines in M5 to M4.

As for sub-capacitor C3, it is disposed between sub-capacitors C1 and C2. In one embodiment, one plate of C3 is formed by the gate electrode 236 of the MOS capacitor 220 and the other plate is formed by one of the groups of conductive lines in first metal level M1. The capacitor dielectric is provided by the PMD layer between the gate electrode and one of the groups of conductive lines in M1 which serves as a capacitor plate. In one embodiment, the group of lines in M1 which forms the capacitor plate is coupled to the opposite terminal to which the gate electrode is coupled. As shown, the gate electrode is coupled to the first capacitor terminal and the second line group of C2 is coupled to the second capacitor terminal. For example, the gate electrode serves as the first plate of C3 while the second line group of C2 serves as the second plate of C3. The third sub-capacitor is formed by part of the FEOL and BEOL processes.

In one embodiment, the first plates of C3 is coupled to the first capacitor terminal and the second plates of the capacitor of C3 is coupled to the second capacitor terminal. This creates a parallel connection between C1, C2 and C3. By providing multiple capacitors coupled in parallel, the capacitance is equal to the sum of capacitors C1, C2 and C3. Furthermore, the C1, C2 and C3 are disposed with the area of C1. As such, the capacitance of the capacitor, as described, is greater than of a conventional MOS capacitor with the same area.

Figure 2C:
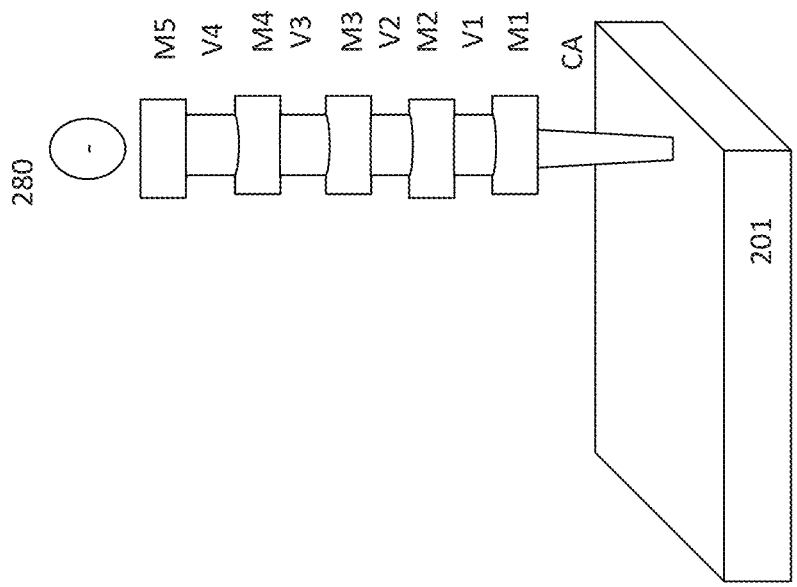
FIGS. 2b-2c show cross-sectional views of exemplary embodiments of first and second terminal connections of a capacitor, respectively.
Figure 2B:
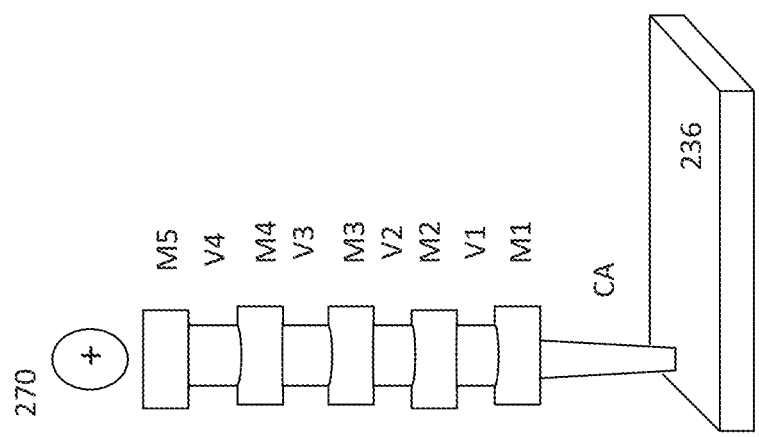

FIGS. 2b-2c show an exemplary interconnections of an embodiment of a capacitor. Referring to FIG. 2b, interconnections from the first or positive terminal 270 to the various capacitors C1, C2 and C3 are shown. As illustrated, the capacitor is disposed in the substrate up to M5. Other configurations of the capacitor may also be useful. The first or positive terminal is coupled to the gate 236 of the MOS capacitor or C1. The connection to the gate also provides connection to C2. The first terminal is also coupled to first lines in M5 and M4 (e.g., C2). As shown, contact pad may be provided in the metal levels and via contacts may be provided in the via levels to provide connections of the first terminal down to the gate. In the case where interconnections are not provided in metal lines of different metal levels, terminal connections may be provided in the different metal levels.

FIG. 2c shows an exemplary embodiment of interconnections from the second or negative positive terminal 280 to the various capacitors C1, C2 and C3. As illustrated, the capacitor is disposed in the substrate up to M5. Other configurations of the capacitor may also be useful. The second or negative terminal is coupled to the substrate 201 in the capacitor region. This forms the connection to C1. The second terminal is also coupled to second lines in M5 and M4. The connection to the second lines also forms the connection to C2. As shown, contact pad may be provided in the metal levels and via contacts may be provided in the via levels to provide connections of the first terminal down to the substrate. In the case where interconnections are not provided in metal lines of different metal levels, terminal connections may be provided in the different metal levels.

FIG. 4 shows a table 400 indicating the percentage of shrinkage of a memory module using a high capacitance per area ratio capacitor based on the density of the memory module. The memory module, in one embodiment, is a NVM module. The capacitors are employed in, for example, the HV charge pump. As shown, about 25% area reduction can be achieved with a memory module having an array of 0.5 Mbits storage. As the density of the array increases, the percentage of shrinkage in the memory module is less. For example, 1 Mbit memory module shows about a 16% area reduction, a 2 Mbit memory module shows about a 10% area reduction and a 4 Mbit memory module shows about a 6% area reduction. The decrease in reduction in area for the memory module as density increases is due to the fact that the array occupies a larger percentage of the overall area of the array.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A non-volatile memory (NVM) charge pump capacitor comprising:
   a substrate including a capacitor region in which the capacitor is disposed, the capacitor includes
      a first sub-capacitor (C1), the first sub-capacitor comprises a high voltage (HV) metal oxide semiconductor (MOS) capacitor which includes a HV gate on the substrate, the HV gate includes a HV gate electrode over a HV gate dielectric, wherein
         a first C1 plate is served by the HV gate electrode,
         a second C1 plate is served by the substrate of the capacitor region, and
         a C1 capacitor dielectric is served by the HV gate dielectric,
      a second sub-capacitor (C2), the second sub-capacitor comprises a back-end-of-line (BEOL) vertical capacitor disposed in interlevel dielectric (ILD) layers with metal levels and via levels, wherein a plurality of metal lines are disposed in the metal levels, the metal lines of a metal level are grouped in alternating first and second groups, the first group serves as first C2 plates and second group serves as second C2 plates and the dielectric layers between the first and second groups serve as C2 capacitor dielectrics, and
      a third sub-capacitor (C3), wherein
         a first C3 plate is served by the HV gate electrode,
         a second C3 plate is served by metal lines of the second group in a first metal level (M1) of the ILD layers, and
         a C3 capacitor dielectric is served by a first via level dielectric below M1 and above the HV gate electrode;
   a first capacitor terminal coupled to first capacitor plates of C1, C2 and C3; and
   a second capacitor terminal coupled to second capacitor plates of C1, C2 and C3.

2. The NVM charge pump capacitor of claim 1 wherein the first capacitor terminal is a positive terminal and the second capacitor terminal is a negative terminal.

3. The NVM charge pump capacitor of claim 1 wherein the HV gate enables the capacitor to function as a NVM charge pump.

4. The NVM charge pump capacitor of claim 1 wherein the BEOL vertical capacitor comprises a lower portion and an upper portion, wherein the lower portion comprises first to fourth metal levels and the upper portion comprises at least the fifth metal level.

5. The NVM charge pump capacitor of claim 4 wherein the lower portion comprises a plurality of metal lines in each metal level and the metal lines are arranged into the alternating first and second groups, wherein the first group of metal lines is connected at a first end of the lines while the second group of metal lines is connected at a second end of the lines.

6. The NVM charge pump capacitor of claim 5 wherein the lines in a metal level are coupled to lines of adjacent metal level by interconnections in a via level in between adjacent metal levels.

7. The NVM charge pump capacitor of claim 6 wherein the interconnections in the via level comprises via contacts, via bars or a combination thereof.

8. The NVM charge pump capacitor of claim 7 wherein the via contacts or via bars are arranged as groups of vias, aligned or staggered.

9. The NVM charge pump capacitor of claim 1 wherein the first capacitor terminal is coupled to the HV gate of the HV MOS capacitor and the second capacitor terminal is coupled to the substrate in the capacitor region.

10. A non-volatile memory (NVM) charge pump comprising:
a pump circuit; and
a high voltage (HV) pump capacitor, wherein the HV pump capacitor comprises
a substrate including a capacitor region in which the HV capacitor is disposed, the HV capacitor includes
a first sub-capacitor (C1), the first sub-capacitor comprises a HV metal oxide semiconductor (MOS) capacitor which includes a HV gate on the substrate, the HV gate includes a HV gate electrode over a HV gate dielectric, wherein
a first C1 plate is served by the HV gate electrode,
a second C1 plate is served by the substrate of the capacitor region, and
a C1 capacitor dielectric is served by the HV gate dielectric,
a second sub-capacitor (C2), the second sub-capacitor comprises a back-end-of-line (BEOL) vertical capacitor disposed in ILD layers with metal levels and via levels, wherein a plurality of metal lines are disposed in the metal levels, the metal lines of a metal level are grouped in alternating first and second groups, the first group serves as first C2 plates and second group serves as second C2 plates and the dielectric layers between the first and second groups serve as C2 capacitor dielectrics,
a third sub-capacitor (C3), wherein
a first C3 plate is served by the HV gate electrode,
a second C3 plate is served by metal lines of the second group in a first metal level (M1) of the ILD layers, and
a C3 capacitor dielectric is formed by a first via level dielectric below M1 and above the HV gate electrode,
a first capacitor terminal coupled to first capacitor plates of C1, C2 and C3, and
a second capacitor terminal coupled to second capacitor plates of C1, C2 and C3.

11. The NVM charge pump of claim 10 wherein the first capacitor terminal is coupled to the HV gate of the HV MOS capacitor and the second capacitor terminal is coupled to the substrate in the capacitor region.

12. The NVM charge pump of claim 11 wherein the first capacitor terminal is a positive terminal and the second capacitor terminal is a negative terminal.

13. The NVM charge pump of claim 11 wherein the HV gate of the HV MOS capacitor enables the capacitor to function as the NVM charge pump.

14. A non-volatile memory (NVM) charge pump capacitor comprising:
a substrate including a capacitor region in which the capacitor is disposed, wherein the capacitor includes
a first sub-capacitor (C1), the first sub-capacitor comprises a high voltage (HV) metal oxide semiconductor (MOS) capacitor,
a second sub-capacitor (C2), the second sub-capacitor comprises a back-end-of line (BEOL) vertical capacitor disposed in interlevel dielectric (ILD) layers with metal levels and via levels over the substrate, and
a third sub-capacitor (C3), the third sub-capacitor is disposed in between C1 and C2, a first C3 plate is served by a HV gate electrode of the HV MOS capacitor, a second C3 plate is served by one group of metal lines in the lowest metal level of the ILD layers and a C3 capacitor dielectric is formed by a dielectric layer of the ILD layers above the HV gate electrode.

15. The NVM charge pump capacitor of claim 14 wherein the BEOL vertical capacitor comprises a lower portion and an upper portion, wherein the lower portion comprises first to fourth metal levels and the upper portion comprises at least the fifth metal level.

16. The NVM charge pump capacitor of claim 15, wherein metal lines in a metal level are coupled to metal lines of adjacent metal level by interconnections in a via level in between adjacent metal levels and wherein the interconnections in the via level comprise via contacts, via bars or a combination thereof and wherein the via contacts or via bars are arranged as groups of vias, aligned or staggered.

17. The NVM charge pump capacitor of claim 16 wherein alternating first and second metal lines in a metal level form first and second plates of a capacitor in the lower or upper portion of the BEOL vertical capacitor.

18. The NVM charge pump capacitor of claim 14 wherein the first, second and third sub-capacitors are coupled in parallel.

19. The NVM charge pump capacitor of claim 18 wherein each of the first, second and third sub-capacitors comprises first and second terminals, wherein the first terminals of the first, second and third sub-capacitors are commonly coupled to form a first capacitor terminal and the second terminals of the first, second and third sub-capacitors are commonly coupled to form a second capacitor terminal.

20. The NVM charge pump capacitor of claim 14 wherein the HV MOS capacitor comprises a HV gate having a HV gate dielectric on the substrate and the HV gate electrode thereby enabling the capacitor to function as the NVM charge pump.

* * * * *